(12) United States Patent
Tang et al.

(10) Patent No.: US 9,520,558 B2
(45) Date of Patent: Dec. 13, 2016

(54) SEMICONDUCTOR STRUCTURES AND MEMORY CELLS INCLUDING CONDUCTIVE MATERIAL AND METHODS OF FABRICATION

(71) Applicant: Micron Technology, Inc., Boise, ID (US)

(72) Inventors: Sanh D. Tang, Boise, ID (US); Scott E. Sills, Boise, ID (US); Whitney L. West, Boise, ID (US); Rob B. Goodwin, Eagle, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/961,479

(22) Filed: Aug. 7, 2013

(65) Prior Publication Data

US 2013/0320291 A1    Dec. 5, 2013

Related U.S. Application Data

(62) Division of application No. 13/050,725, filed on Mar. 17, 2011, now Pat. No. 8,524,599.

(51) Int. Cl.
*H01L 45/00* (2006.01)
*H01L 21/768* (2006.01)
*H01L 23/532* (2006.01)

(52) U.S. Cl.
CPC ......... *H01L 45/145* (2013.01); *H01L 21/7684* (2013.01); *H01L 21/76843* (2013.01);
(Continued)

(58) Field of Classification Search
CPC ............. H01L 45/145; H01L 21/76883; H01L 23/53247; H01L 23/53252; H01L 21/7684; H01L 21/76843; H01L 21/76849; H01L 21/76858; H01L 21/76877; H01L 21/76882; H01L 45/1608; H01L 45/04; H01L 45/085; H01L 45/1233; H01L 45/1266; H01L 45/141

See application file for complete search history.

(56) References Cited

U.S. PATENT DOCUMENTS 5,529,954 A   6/1996  Iijima et al.
5,719,447 A   2/1998  Gardner
(Continued)

FOREIGN PATENT DOCUMENTS

CN   100533674 C   8/2009
JP   2004-40742 A   2/2000
(Continued)

OTHER PUBLICATIONS

Supplementary European Search Report and Search Opinion, Application No. EP 12757934.0, Aug. 4, 2014, nine (9) pages.
(Continued)

*Primary Examiner* — Savitr Mulpuri
(74) *Attorney, Agent, or Firm* — TraskBritt (57) ABSTRACT

Methods of forming conductive elements, such as interconnects and electrodes, for semiconductor structures and memory cells. The methods include forming a first conductive material and a second conductive material comprising silver in a portion of at least one opening and performing a polishing process to fill the at least one opening with at least one of the first and second conductive materials. An annealing process may be performed to form a mixture or an alloy of the silver and the first conductive material. The methods enable formation of silver containing conductive elements having reduced dimensions (e.g., less than about 20 nm). The resulting conductive elements have a desirable resistivity. The methods may be used, for example, to form inter-
(Continued)

connects for electrically connecting active devices and to form electrodes for memory cells. A semiconductor structure and a memory cell including such a conductive structure are also disclosed.

14 Claims, 8 Drawing Sheets

(52) U.S. Cl.
CPC .. *H01L 21/76849* (2013.01); *H01L 21/76858* (2013.01); *H01L 21/76877* (2013.01); *H01L 21/76882* (2013.01); *H01L 21/76883* (2013.01); *H01L 23/53247* (2013.01); *H01L 23/53252* (2013.01); *H01L 45/04* (2013.01); *H01L 45/085* (2013.01); *H01L 45/1233* (2013.01); *H01L 45/1266* (2013.01); *H01L 45/141* (2013.01); *H01L 45/16* (2013.01); *H01L 45/1608* (2013.01); *H01L 2924/0002* (2013.01)

(56) References Cited

U.S. PATENT DOCUMENTS

| | | | |
|---|---|---|---|
| 6,100,194 | A | 8/2000 | Chan et al. |
| 6,143,655 | A | 11/2000 | Forbes et al. |
| 6,465,345 | B1 | 10/2002 | Nogami et al. |
| 6,511,906 | B1 | 1/2003 | Sinha |
| 6,757,971 | B2 | 7/2004 | Sinha |
| 6,936,545 | B1 | 8/2005 | Xie et al. |
| 6,946,392 | B2 | 9/2005 | Sinha |
| 6,969,301 | B2 | 11/2005 | Sinha |
| 7,033,930 | B2 | 4/2006 | Kozhukh et al. |
| 7,118,707 | B2 | 10/2006 | Robinson |
| 7,199,052 | B2 | 4/2007 | Cohen |
| 7,229,924 | B2 | 6/2007 | Farrar |
| 7,332,401 | B2 | 2/2008 | Moore et al. |
| 7,423,282 | B2 | 9/2008 | Park et al. |
| 7,694,871 | B2 | 4/2010 | Ronay |
| 7,718,537 | B2 | 5/2010 | Ufert |
| 2003/0041452 | A1 | 3/2003 | Sinha |
| 2003/0047771 | A1 | 3/2003 | Kweon et al. |
| 2003/0134436 | A1 | 7/2003 | Yates et al. |
| 2003/0143838 | A1 | 7/2003 | Kozhukh et al. |
| 2003/0203526 | A1 | 10/2003 | Lin et al. |
| 2004/0038523 | A1 | 2/2004 | Kozhukh et al. |
| 2004/0155349 | A1 | 8/2004 | Nakamura et al. |
| 2005/0282378 | A1 | 12/2005 | Fukunaga et al. |
| 2006/0046453 | A1 | 3/2006 | Collins et al. |
| 2006/0084271 | A1 | 4/2006 | Yang et al. |
| 2006/0094236 | A1 | 5/2006 | Elkins et al. |
| 2006/0289999 | A1 | 12/2006 | Lee et al. |
| 2007/0018329 | A1 | 1/2007 | Oh et al. |
| 2007/0139987 | A1 | 6/2007 | Kouchiyama et al. |
| 2007/0145586 | A1 | 6/2007 | Onishi et al. |
| 2008/0036508 | A1 | 2/2008 | Sakamoto et al. |
| 2008/0128912 | A1 | 6/2008 | Streck et al. |
| 2008/0253165 | A1 | 10/2008 | Blanchard |
| 2009/0239398 | A1 | 9/2009 | Lynch et al. |
| 2010/0003814 | A1 | 1/2010 | Lee et al. |
| 2010/0078820 | A1 | 4/2010 | Kurokawa et al. |
| 2010/0163829 | A1 | 7/2010 | Wang et al. |
| 2010/0193758 | A1 | 8/2010 | Tian et al. |
| 2011/0115096 | A1 | 5/2011 | Bradl et al. |
| 2012/0235106 | A1 | 9/2012 | Tang et al. |

FOREIGN PATENT DOCUMENTS

| | | |
|---|---|---|
| JP | 200040742 A | 2/2000 |
| JP | 2003133534 A | 5/2003 |
| JP | 2004-235620 A | 8/2004 |
| JP | 2007-27769 A | 2/2007 |
| JP | 2007157941 A | 6/2007 |
| JP | 2007157942 A | 6/2007 |
| JP | 2007180173 A | 7/2007 |
| TW | 591705 B | 6/2004 |

OTHER PUBLICATIONS

International Preliminary Report on Patentability for PCT Application No. PCT/US2012/028878, (dated Sep. 17, 2013), 6 pages.
Gao et al., "Thermal Stability of Titanium Nitride Diffusion Barrier Films for Advanced Silver Interconnects," Microelectronic Engineering, vol. 76, (2004), pp. 76-81.
PCT International Search Report and Written Opinion for PCT Application No. PCT/US2012/028878, mailed Oct. 16, 2012, 8 pages.
Ushiku et al., "Planarized Silver Interconnect Technology with a Ti Self-Passivation Technique for Deep Sub-Micron ULSIs," VLSI Technology Digest of Technical Papers, (1993), pp. 121-122.
Search Report for Taiwan Application No. 101109223, (dated Jan. 14, 2014), 1 page.
Search Report of the State Intellectual Property Office of China, Chinese Application No. 201280018861.1, (dated Nov. 17, 2014), 2 pages.
European Office Action for European Application No. 12757934.0, (dated Jun. 12, 2015), 4 pages.
Japanese Office Action for Japanese Application No. 2014-135499, (dated Apr. 21, 2015), 5 pages (with annotation indicating translated sections).
Taiwan Office Action and Search Report for Taiwan Application No. 103120618 dated Dec. 16, 2015, ten (10) pages.

SEMICONDUCTOR STRUCTURES AND MEMORY CELLS INCLUDING CONDUCTIVE MATERIAL AND METHODS OF FABRICATION

CROSS-REFERENCE TO RELATED APPLICATION

This application is a divisional of U.S. patent application Ser. No. 13/050,725, filed Mar. 17, 2011, now U.S. Pat. No. 8,524,599, issued Sep. 3, 2013, the disclosure of which application is hereby incorporated in its entirety herein by this reference.

TECHNICAL FIELD

Embodiments of the present disclosure relate to methods of forming conductive elements for semiconductor devices and, in addition, to semiconductor structures that include such conductive elements.

BACKGROUND

Integrated circuits (ICs), the key components in thousands of electronic systems, generally include interconnected networks of electrical components fabricated on a common foundation, or substrate. Conductive interconnects are used to electrically connect semiconductor devices, such as capacitors or transistors, or to define a specific IC, such as a computer memory or microprocessor. The quality of the conductive interconnects greatly affects overall manufacturability, performance, and lifetime of the IC. Thus, the material used to form the conductive interconnects is increasingly determining the limits in performance, density, and reliability of integrated circuits.

For example, electrical conductivity of interconnects is extremely significant to the operational speed of the integrated circuit (IC). Aluminum (Al) and alloys thereof have been widely used as interconnect materials in semiconductor devices based on their low resistivity and ready adhesion to interlayer dielectric materials, such as silicon dioxide ($SiO_2$). Unfortunately, aluminum is susceptible to corrosion and offers poor resistance to electromigration, which increases the potential for open circuits from voids or short circuits.

In an attempt to improve the performance, reliability, and density of the conductive interconnects, alternative metals to aluminum and aluminum alloys are being explored. To improve conductivity in the wiring, it has been proposed that copper (Cu) and alloys thereof be used to form conductive interconnects. However, copper rapidly diffuses through many conventional dielectric materials to form undesired copper oxide compounds. In addition, copper does not adhere well to conventional dielectric materials or to itself.

Silver (Ag) has also been proposed as a substitute for aluminum-containing conductive interconnects and is becoming increasingly significant in use as an electrochemically active material in electrodes of programmable memory cells, such as those of conductive bridge random access memory (conductive bridge RAM) cells. Silver has an extremely low resistivity, but is difficult to deposit in narrow gaps (e.g., gaps having a dimension of 20 nm or less) due to limitations on currently available deposition techniques. While silver may be deposited by sputtering (physical) deposition techniques, these techniques are not suitable for filling narrow gaps with silver. Furthermore, interconnects have been difficult to form from silver due to adhesion issues and agglomeration at increased temperatures. Since silver is resistant to dry etch processes, conventional techniques for forming semiconductor conductive elements (e.g., interconnects and electrodes) are impractical for making such conductive elements from silver.

BRIEF DESCRIPTION OF THE DRAWINGS

FIGS. 3B1 through 3D are partial cross-sectional views of a semiconductor structure and illustrate a method of forming the conductive bridge RAM cell shown in FIG. 3A in accordance with embodiments of the present disclosure.

DETAILED DESCRIPTION

Methods of forming conductive elements, such as interconnects and electrodes, are disclosed, as are semiconductor structures and memory devices that include such conductive elements. The conductive element is formed from a silver material, such as silver or a silver alloy. Since silver has low resistivity and alloys and mixtures with other materials, the resistivity of the conductive element may be less than or equal to that of a conductive element formed from copper. In addition, use of a silver alloy or silver mixture may substantially reduce or eliminate issues with agglomeration associated with silver during thermal processing acts conducted at a later stage of semiconductor processing including such conductive elements. Using silver, a silver alloy, or a silver mixture may also enable narrow openings, such as those having at least one dimension of less than about 20 nm, to be filled.

As used herein, the term "alloy" means and includes a homogeneous mixture or solid solution of a plurality of materials (e.g., metals or nonmetals), with atoms of one of the materials occupying interstitial positions between atoms of another one of the materials. By way of example and not limitation, an alloy may include a mixture of silver and a metal selected from platinum, aluminum, tin, copper, iridium, titanium, nickel, cobalt, ruthenium, and rhodium.

As used herein, the term "mixture" means and includes a material formed by mixing a plurality of metals or a metal and a nonmetal. By way of example and not limitation, a mixture may include a mixture of silver and a metal such as tungsten.

As used herein, the term "liner" means and includes any structure that overlies a surface of at least one material. By way of example and not limitation, a liner may include a layer of material disposed over another material.

As used herein, the term "adhesion material" means and includes a material selected to facilitate adhesion of a first material to a second material immediately adjacent the first material.

As used herein, the term "chalcogenide" means and includes a material, including a glass or crystalline material, that includes an element from Group VIA (also identifiable as Group 16) of the periodic table of elements. Group VIA elements, often referred to as "chalcogens," include sulfur (S), selenium (Se), tellurium (Te), polonium (Po), and oxygen (O). Examples of chalcogenides include, but are not limited to, germanium selenide (GeSe), germanium sulfide (GeS), germanium telluride (GeTe), indium selenide (InSe), and antimony selenide (SbSe). While the exemplary chalcogenides have a stoichiometry of one atom of each element, the chalcogenide may have other stoichiometries.

As used herein, the terms "redistribute" and "redistributing" mean and include spreading or smearing a material across a surface and into a partially filled, lined or, previously unfilled opening (e.g., via, trench) in a structure to fill or substantially fill the opening with the material.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures, or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor structures described below do not necessarily form a complete semiconductor device. Only those process acts and structures necessary to understand the embodiments of the present disclosure are described in detail below. Additional acts to form a complete semiconductor device from the semiconductor structures may be performed by conventional fabrication techniques.

Figure 1A:
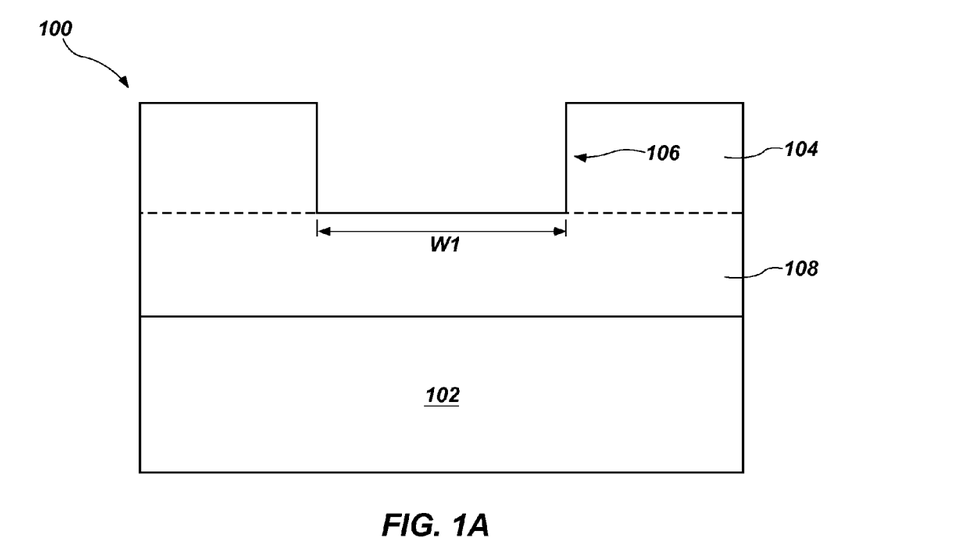
FIGS. 1A through 1E are partial cross-sectional views of a semiconductor structure and illustrate a method of forming an interconnect in accordance with embodiments of the present disclosure.

FIGS. 1A through 1E are simplified partial cross-sectional views of a semiconductor structure 100 illustrating embodiments of a method of forming interconnects. Referring to FIG. 1A, the semiconductor structure 100 may include an opening 106 in a material 104 overlying a substrate 102. The material 104 may be formed from silicon nitride ($Si_3N_4$), silicon dioxide ($SiO_2$), or a silicon oxynitride ($SiO_xN_y$), for example. The material 104 may be formed over the substrate 102 using a conventional deposition process, such as a chemical vapor deposition process, an atomic layer deposition process, or a physical vapor deposition process.

The semiconductor structure 100 may, optionally, include an electrode material 108 (shown in broken lines) between the material 104 and the substrate 102. The electrode material 108 may be formed from a conductive material, such as tungsten (W), platinum (Pt), titanium nitride (TiN), or nickel (Ni). The electrode material 108 may be formed over the substrate 102 using a conventional deposition process, such as a chemical vapor deposition process or an atomic layer deposition process. While FIGS. 1A through 1E indicate that the electrode material 108 is present, it is understood that the electrode material 108 is optional and that material 104 may be in direct contact with substrate 102 with the opening 106 extending at least partially through material 104.

The opening 106 may be formed by removing a portion of the material 104 using, for example, conventional photolithography techniques (e.g., masking and etching) known in the art of integrated circuit fabrication. By way of non-limiting example, the opening 106 may extend longitudinally into a plane of FIG. 1A. Removing the portion of the material 104 may expose a surface of the material 104 or, if present, a surface of the electrode material 108. By way of example and not limitation, the opening 106 may have a width W1 of less than about 100 nm and, more particularly, less than about 20 nm. The aspect ratio of the opening 106 may be between about 1:1 and about 20:1 and, more particularly, between about 5:1 and about 10:1. The elements shown in FIG. 1A and the following figures have been drawn for the purposes of illustration and should not be understood as being drawn to scale.

Figure 1B:
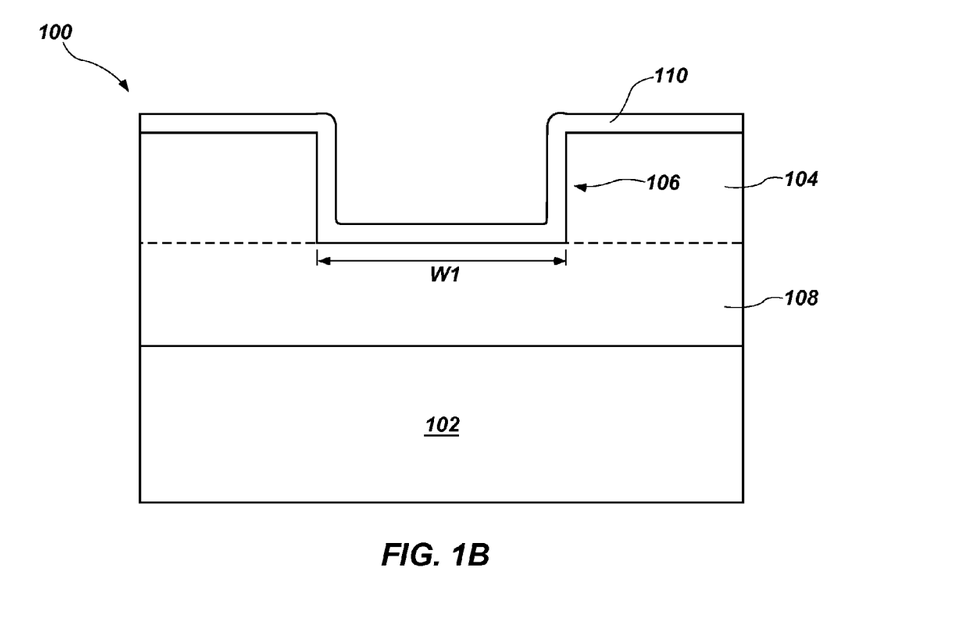

Referring to FIG. 1B, a liner material 110 may be formed over surfaces of the semiconductor structure 100 (i.e., exposed surfaces of the material 104 and, if present, the electrode material 108). For example, the liner material 110 may be formed over surfaces exposed within the opening 106 (i.e., exposed sidewalls of the material 104 and an exposed surface of the electrode material 108, if present) as well as exposed, unrecessed surfaces of the material 104. In embodiments in which the electrode material 108 is present, the liner material 110 may be formed from a material that facilitates adhesion to and reduces contact resistance in the electrode material 108, or provides both characteristics. For example, the liner material 110 may be formed from at least one of platinum (Pt), tantalum (Ta), aluminum (Al), tin (Sn), copper (Cu), iridium (Ir), titanium (Ti), nickel (Ni), cobalt (Co), ruthenium (Ru), and rhodium (Rh). The liner material 110 may be formed using a conventional deposition process, such as a chemical vapor deposition process, a physical vapor deposition process, or a sputtering process. By way of example and not limitation, the liner material 110 may be formed having a thickness of between about 0.5 nm and about 20 nm and, more particularly, between about 1 nm and about 5 nm.

Figure 1C:
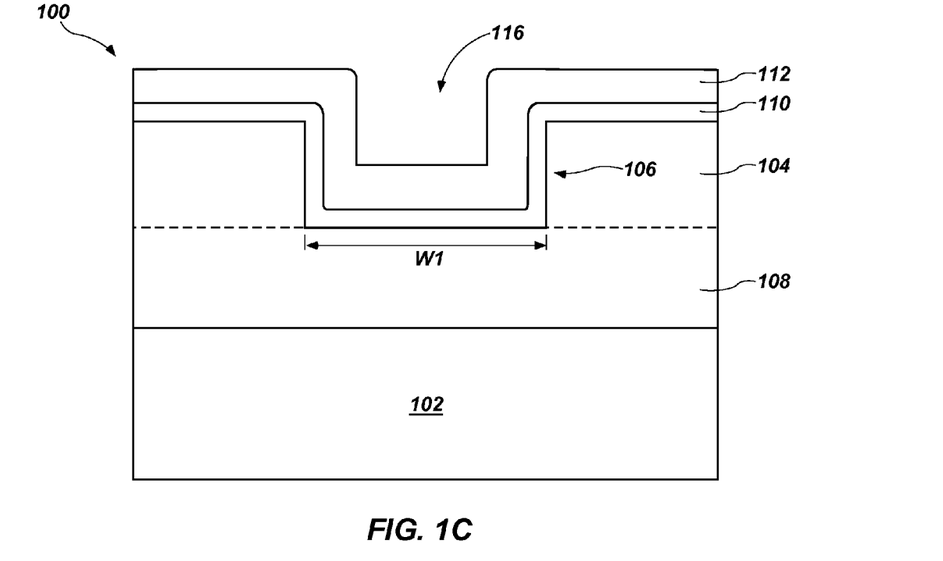

Referring to FIG. 1C, a conductive material 112 may be formed over the liner material 110. The conductive material 112 may be formed from silver (Ag), an alloy, or a mixture thereof using a conventional deposition process, such as a physical vapor deposition process or a physical deposition process. Conventional vapor deposition processes (e.g., chemical vapor deposition and physical vapor deposition) may not effectively deposit silver in narrow openings (e.g., openings having at least one dimension of less than or equal to 20 nm). Thus, in embodiments in which at least one dimension (i.e., the width W1) of the opening 106 is less than or equal to about 20 nm, a sputtering process may be used to form the conductive material 112 within the opening 106. By way of non-limiting example, the conductive material 112 may be substantially conformally deposited over an entire exposed surface of the liner material 110. The conductive material 112 may be formed having a thickness sufficient to at least partially fill the remaining portion of the opening 106. As shown in FIG. 1C, a portion of the opening 106 may remain unfilled (i.e., unfilled region 116) after the conductive material 112 has been formed on the semiconductor structure 100. By way of example and not limitation, the conductive material 112 may be formed from silver and have a thickness of between about 5 nm and about 30 nm and, more particularly, between about 10 nm and about 20 nm.

The thicknesses of the liner material 110 and the conductive material 112 may be selected based on a desired ratio of materials. In embodiments in which the liner material 110 includes platinum and the conductive material 112 includes silver, a ratio of the liner material 110 to the conductive material 112 may be less than or equal to about 1 to 2.

Figure 1D:
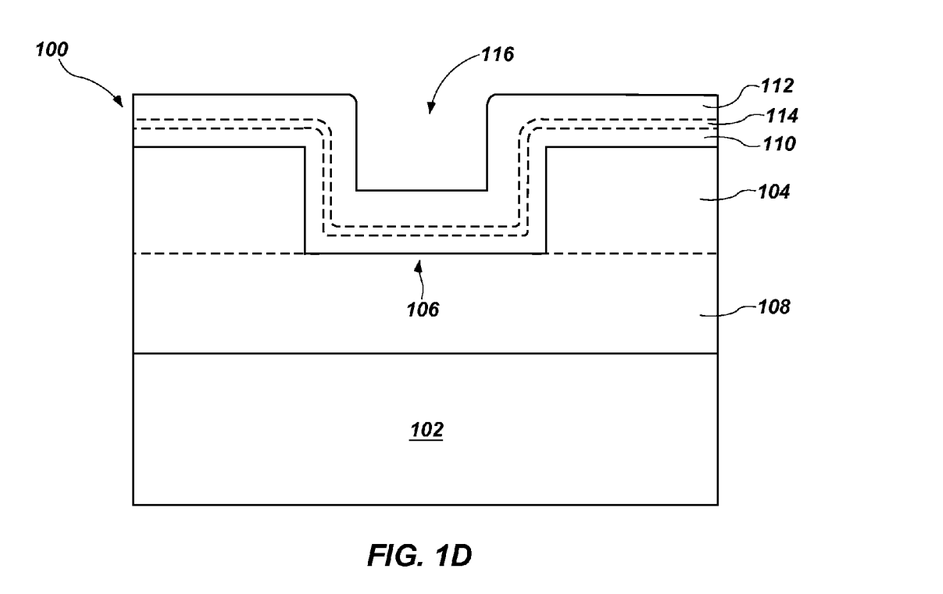

Referring to FIG. 1D, in embodiments in which the liner material 110 (shown in broken lines) includes a material that forms an alloy with the conductive material 112, an annealing process may optionally be performed to form an alloy of the liner material 110 and the conductive material 112. By reacting the liner material 110 and the conductive material 112, an intermetallic compound is formed. For example, the conductive material 112 may include silver, the liner material 110 may include at least one material, such as platinum, aluminum, tin, copper, iridium, titanium, nickel, cobalt, ruthenium, and rhodium, which reacts with the silver to form the alloy. By way of example and not limitation, the annealing process may include exposing the semiconductor structure 100 to a temperature of between about 100° C. and about 500° C. and, more particularly, a temperature of about 200° C. During the annealing process, a material 114 (shown in broken lines) that includes the alloy may be formed at an interface between the conductive material 112 and the material 104 underlying the remaining (i.e., non-alloyed) portions of the conductive material 112. The alloy may include a substantially homogeneous mixture of the liner material 110 and the conductive material 112, or may be a heterogeneous mixture that includes regions having different ratios of the liner material 110 to the conductive material 112. In embodiments in which the liner material 110 includes platinum and the conductive material 112 includes silver, the semiconductor structure 100 may be exposed to a temperature of about 200° C. such that the platinum and the silver combine to form a silver-platinum alloy. The liner material 110 may be at least substantially completely alloyed with the conductive material 112 to form the material 114, or a portion of the liner material 110 may remain at an interface between the material 114 and surfaces of the material 104 and the electrode material 108, if present.

In embodiments in which the liner material 110 is formed from a material that does not form an alloy with the conductive material 112, the annealing process may be bypassed and the liner material 110 may remain at the interface between the conductive material 112 and the material 104 and, if present, the electrode material 108 (as shown in FIG. 1C). For example, the conductive material 112 may include silver, the liner material 110 may comprise tantalum, and the tantalum may be disposed between the silver, the material 104, and, if present, the electrode material 108.

Figure 1E:
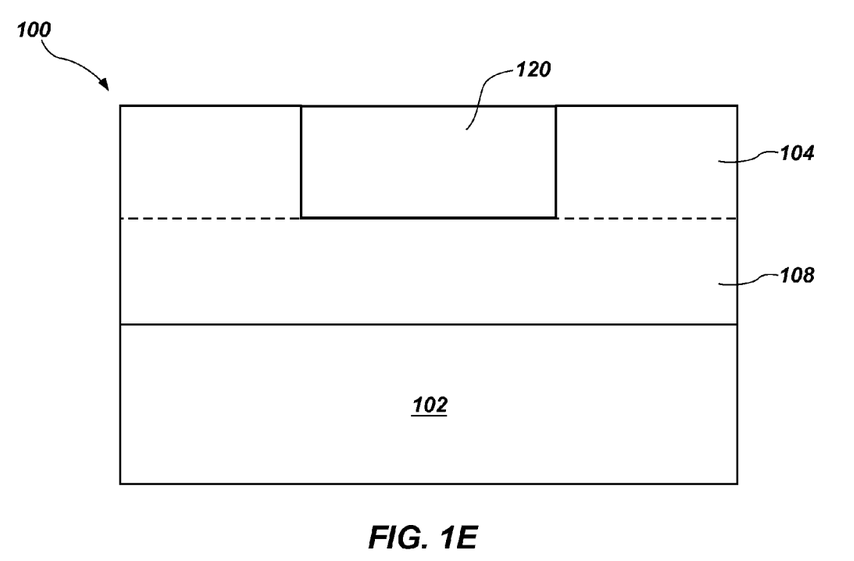

An exposed surface of the semiconductor structure 100 may be subjected to a material removal process, such as a so-called polishing process in the form of, for example, a chemical mechanical polishing (CMP) process or a mechanical polishing process, to form an interconnect 120, as shown in FIG. 1E. For example, the employed process may be used to remove portions of each of the liner material 110, the conductive material 112, and, if present, the material 114 overlying the material 104 (FIG. 1D). In addition, the process may be used to redistribute at least one of the conductive material 112, the liner material 110, and the material 114, if present, into the unfilled region 116 of the opening 106 (FIG. 1D) to substantially completely fill the opening 106. Without wishing to be bound by any particular theory, it is believed that malleable materials, such as the conductive material 112 and, optionally, the liner material 110 and the material 114, may be mechanically pushed or redistributed into voids (e.g., the unfilled region 116) during the polishing process, thus filling the unfilled region 116 of the opening 106. However, mechanical stresses exerted on the malleable materials during the polishing process may cause the malleable materials to pull out of the opening 106. Such mechanical stresses may be substantially reduced or eliminated by leaving a portion of the opening 106 unfilled and by improving adhesion between the conductive material 112 and the underlying material (i.e., material 104 or, if present, the electrode material 108). For example, in embodiments in which the conductive material 112 is formed from a material (e.g., silver) that exhibits poor adhesion with an underlying region (e.g., the electrode material 108), the liner material 110 may substantially improve adhesion between the conductive material 112 and the underlying region to prevent the conductive material 112 from being removed from the opening 106 by the mechanical stresses.

The polishing process may be a chemical mechanical polishing process that is performed using a conventional chemical mechanical polishing apparatus and a slurry that enables redistribution of the malleable materials (e.g., the conductive material 112 and, optionally, the liner material 110) into the unfilled region 116 of the opening 106 to form the interconnect 120. Such a slurry may be, for example, an alumina-based slurry at a neutral or slightly basic pH that is substantially free of oxidizer. The polishing process may also be a mechanical polishing process performed using the conventional chemical mechanical polishing apparatus and water (e.g., deionized water) instead of a chemical slurry. Using water as the liquid component in the polishing process, without addition of chemical etching agents, may enable redistribution of the conductive material 112 and the liner material 110, if present, into the unfilled region of the opening 106 without substantially removing such materials.

After forming the interconnect 120, another annealing process may, optionally, be performed. By way of example and not limitation, this annealing process may include exposing the semiconductor structure 100 of FIG. 1E to a temperature of between about 100° C. and about 500° C. and, more particularly, about 200° C. The annealing process may result in formation of an alloy of the materials of the interconnect 120 (conductive material 112 and the liner material 110), as previously discussed. After annealing, the interconnect 120 may include regions of the conductive material 112, the liner material 110, and the alloy or may substantially include the alloy.

For the sake of simplicity, the methods described with respect to FIGS. 1A through 1E illustrate a method of forming a single interconnect 120. However, as would be understood by one of ordinary skill in the art, a plurality of interconnects or a network of metal routing (e.g., a metallization layer) may be formed using the methods described with respect to FIGS. 1A through 1E. The interconnect 120 may be present in various semiconductor devices, as would be understood by one of ordinary skill in the art. For example, the interconnect 120 may be used to electrically connect active devices, such as transistors, capacitors, etc. The interconnect 120 may include a portion of a network of metal routing electrically connecting such active devices.

Figure 2A:
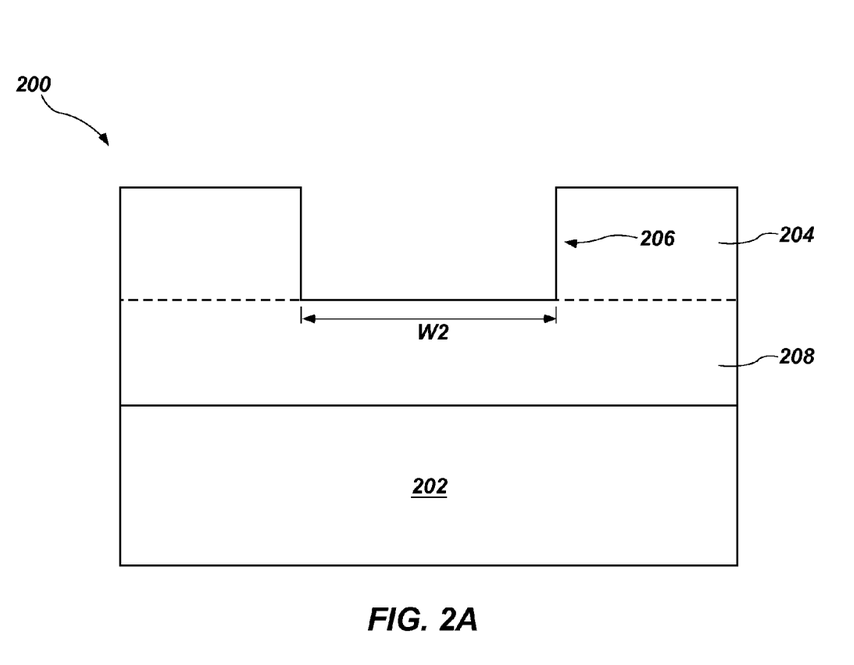
FIGS. 2A through 2E are partial cross-sectional views of a semiconductor structure and illustrate another method of forming an interconnect in accordance with embodiments of the present disclosure.

FIGS. 2A through 2E are simplified partial cross-sectional views of a semiconductor structure 200 illustrating embodiments of another method of forming an interconnect. As shown in FIG. 2A, the semiconductor structure 200 may be formed including an opening 206 in a material 204 overlying a substrate 202. The opening 206 may have a width W2 of less than about 100 nm and, more particularly, less than about 20 nm. The opening 206 may expose a surface of the material 204 or, if present, an optional electrode material 208 (shown in broken lines) disposed between the material 204 and the substrate 202. The semiconductor structure 200 shown in FIG. 2A may be formed using substantially the same methods used to form the semiconductor structure 100 shown in FIG. 1A. While FIGS. 2A through 2E indicate that the electrode material 208 is present, it is understood that the electrode material 208 is optional and that material 204 may be in direct contact with substrate 202 with the opening 206 extending at least partially through material 204.

Figure 2B:
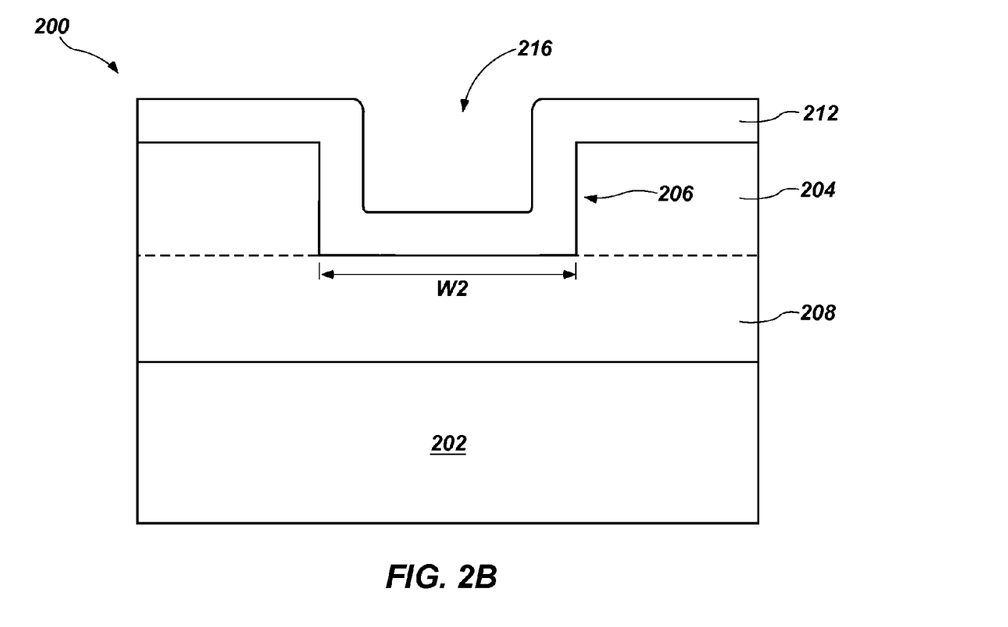

Referring to FIG. 2B, a conductive material 212 may be formed over the semiconductor structure 200 (e.g., over exposed surfaces of each of the material 204 and the electrode material 208, if present). The conductive material 212 may be formed from silver (Ag) or an alloy thereof using a conventional deposition process, such as a chemical vapor deposition process, a physical vapor deposition process, or a physical deposition process. Conventional vapor deposition processes (e.g., chemical vapor deposition and physical vapor deposition) may not effectively deposit silver in narrow openings (e.g., openings having at least one dimension of less than or equal to 20 nm). Thus, in embodiments in which at least one dimension (i.e., the width W2) of the opening 206 is less than or equal to about 20 nm, a sputtering process may be used to form the conductive material 212 within the opening 206. By way of non-limiting example, the conductive material 212 may be substantially conformally deposited over an entire exposed surface of the semiconductor structure 200. The conductive material 212 may be formed having a thickness sufficient to at least partially fill the opening 206. A portion of the opening 206 may remain unfilled (i.e., unfilled region 216) after deposition of the conductive material 212. By way of example and not limitation, the conductive material 212 may be formed from silver and have a thickness of between about 5 nm and about 30 nm and, more particularly, between about 10 nm and about 20 nm.

Figure 2C:
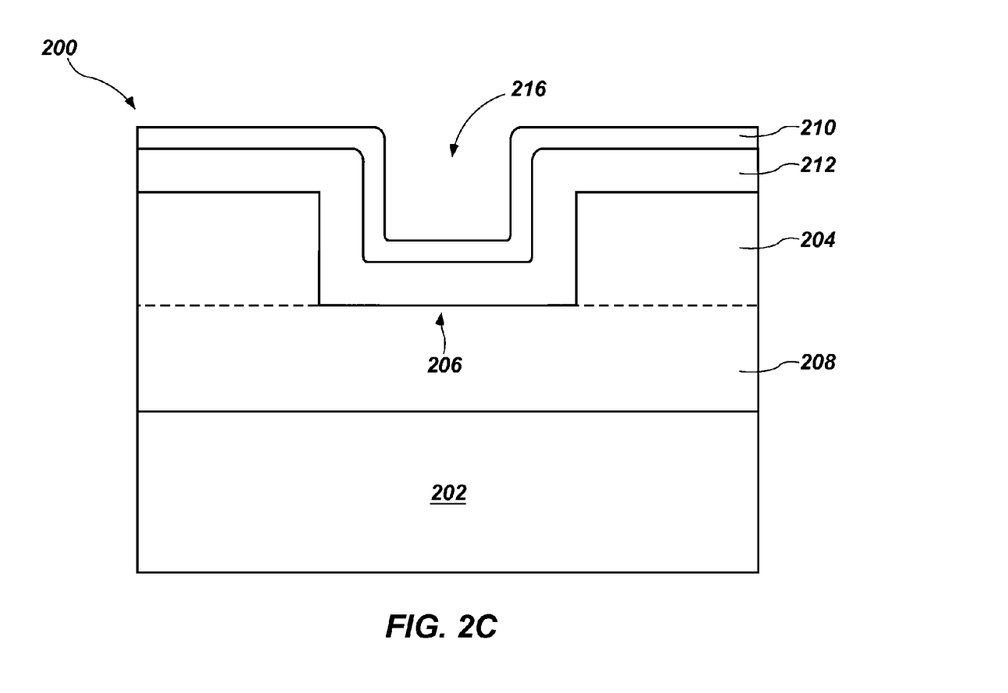

Referring to FIG. 2C, a liner material 210 may be formed over surfaces of the conductive material 212. The liner material 210 may be formed from a material that facilitates adhesion to and/or reduces contact resistance in an upper electrode (not shown) that may be formed over a completed interconnect, as will be discussed in further detail. For example, the liner material 210 may be formed from at least one of platinum, aluminum, tin, copper, iridium, titanium, nickel, cobalt, ruthenium, and rhodium. The liner material 210 may be formed using a conventional deposition process, such as a chemical vapor deposition process, a physical vapor deposition process, or a sputtering process. As shown in FIG. 2C, a portion of the unfilled region 216 of the opening 206 may remain after the liner material 210 has been formed over the conductive material 212. By way of example and not limitation, the liner material 210 may be formed having a thickness of between about 0.5 nm and about 20 nm and, more particularly, between about 1 nm and about 5 nm.

The thicknesses of the liner material 210 and the conductive material 212 may be selected based on a desired ratio of materials. In embodiments in which the liner material 210 includes platinum and the conductive material 212 includes silver, a ratio of the liner material 210 to the conductive material 212 may be less than or equal to about 1 to 2.

Figure 2D:
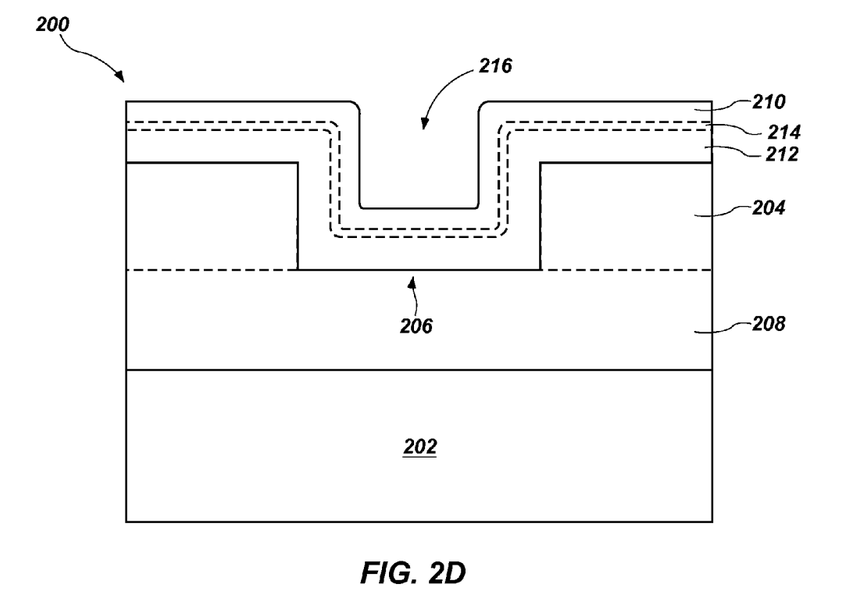

Referring to FIG. 2D, in embodiments in which the liner material 210 (shown in broken lines) includes a material that forms an alloy with the conductive material 212, an annealing process may optionally be performed to form an alloy of the conductive material 212 and the liner material 210. For example, the conductive material 212 may include silver, the liner material 210 may include at least one material, such as platinum, aluminum, tin, copper, iridium, titanium, nickel, cobalt, ruthenium, and rhodium, which reacts with the silver to form the alloy. By way of example and not limitation, the annealing process may include exposing the semiconductor structure 200 to a temperature of between about 100° C. and about 500° C. and, more particularly, about 200° C. During the annealing process, at least a portion of the conductive material 212 and the liner material 210 may be converted to form a material 214 (shown in broken lines) that includes the alloy. The alloy in the material 214 may include a substantially homogeneous mixture of the liner material 210 and the conductive material 212, or may be a heterogeneous mixture that includes regions having different ratios of the liner material 210 to the conductive material 212. In embodiments in which the liner material 210 includes platinum and the conductive material 212 includes silver, the semiconductor structure 200 may be exposed to a temperature of about 200° C. such that the platinum and the silver combine to form a silver-platinum alloy. The liner material 210 may be at least substantially completely alloyed with the conductive material 212 to form the material 214, or a portion of the liner material 210 may remain overlying the material 214.

In embodiments in which the liner material 210 is formed from a material that does not form an alloy with the conductive material 212, the annealing process may be bypassed and the liner material 210 may remain over the conductive material 212 (as shown in FIG. 2C). For example, the conductive material 212 may include silver, the liner material 210 may comprise tantalum, and the tantalum may be disposed over the silver.

Figure 2E:
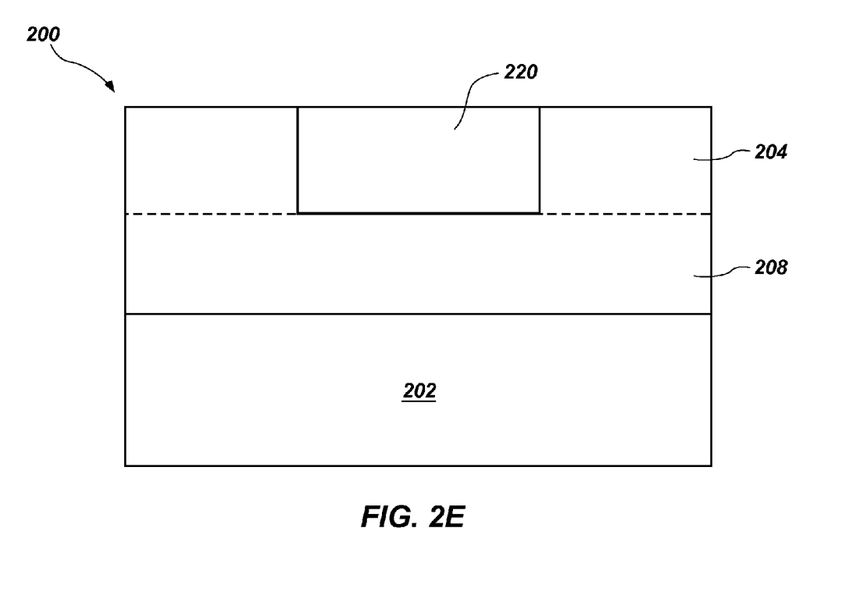

An exposed surface of the semiconductor structure 200 may be subjected to a material removal process, such as a so-called polishing process in the form of a chemical mechanical polishing (CMP) process or a mechanical polishing process, to form an interconnect 220, as shown in FIG. 2E. For example, the employed process may be used to remove portions of each of the conductive material 212 and, if present, the material 214 and/or the liner material 210 overlying the material 204 (FIG. 2D). In addition, the polishing process may be used to redistribute at least one of the conductive material 212, the material 214, and/or the liner material 210 into the unfilled region 216 of the opening 206 (FIG. 2D) to substantially completely fill the opening 206. Without wishing to be bound by any particular theory, it is believed that malleable materials (e.g., the conductive material 212 and, optionally, the liner material 210 and/or the material 214) may be mechanically pushed or redistributed into voids (e.g., the unfilled region 216 of the opening 206) during the polishing process, thus filling the unfilled region 216 of the opening 206. However, mechanical stresses exerted on the malleable materials during the polishing process may cause the malleable materials to pull out of the opening 206. Such mechanical stresses may be substantially reduced or eliminated by leaving a portion of the opening 206 unfilled and by improving adhesion between the conductive material 212 and the underlying material (i.e., the material 204 or, if present, the electrode 208). The polishing process may be a chemical mechanical polishing process or a mechanical polishing process, as previously discussed with respect to FIG. 1E.

After forming the interconnect 220, another annealing process may, optionally, be performed. By way of example and not limitation, the annealing process may include exposing the semiconductor structure 200 to a temperature of between about 100° C. and about 500° C. and, more particularly, to a temperature of about 200° C. The annealing process may result in formation of an alloy of the conductive material 212 and the liner material 210, as previously discussed. After annealing, the interconnect 220 may include regions of the conductive material 212, the liner material 210, and the alloy or may substantially include the alloy.

For the sake of simplicity, the methods described with respect to FIGS. 2A through 2E illustrate a method of forming a single interconnect 220. However, as would be understood by one of ordinary skill in the art, a plurality of interconnects or a network of metal routing (e.g., a metallization layer) may be formed using the methods described with respect to FIGS. 2A through 2E. The interconnect 220 may be present in various semiconductor devices, as would be understood by one of ordinary skill in the art. For example, the interconnect 220 may be used to electrically connect active devices, such as transistors, capacitors, etc. The interconnect 220 may include a portion of a network of metal routing electrically connecting such active devices.

Figure 3A:
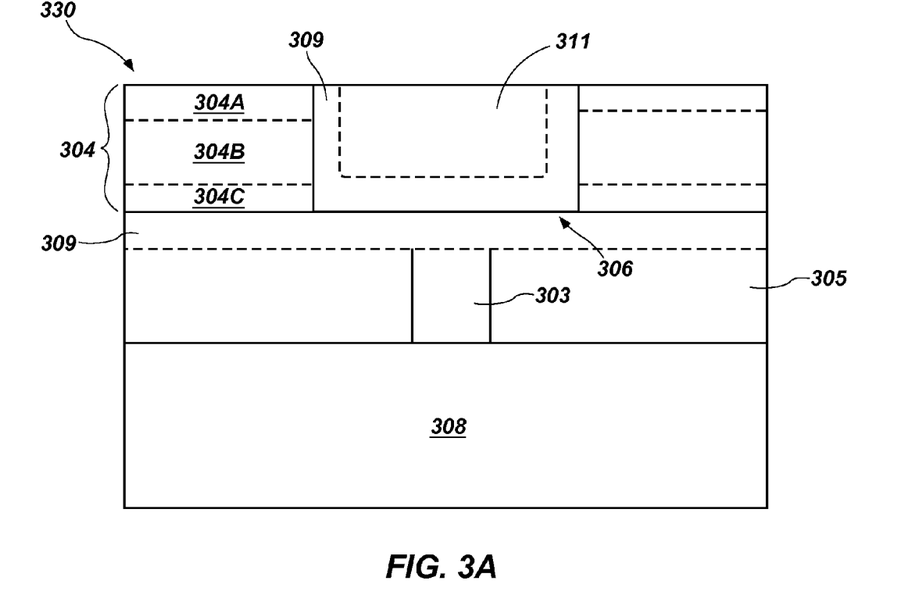
FIG. 3A is a partial cross-sectional view of a conductive bridge random access memory (conductive bridge RAM) cell.

FIG. 3A through 3D are simplified partial cross-sectional views of a semiconductor structure 300 illustrating embodiments of a method of forming a conductive element for a semiconductor device, such as an electrode 311 of a conductive bridge random access memory (conductive bridge RAM) device. A conductive bridge RAM device may include a plurality of memory cells, one of which is shown in FIG. 3A. A conductive bridge RAM cell 330 may include a memory material 309, disposed between a first electrode 308 and a second electrode 311. For example, the memory material 309 may be disposed over a surface of an underlying material or over exposed surfaces of an opening 306, as will be described in further detail. The memory material 309 and the second electrode 311 may overlie a conductive structure 303 that provides an electrical connection between the first and second electrodes 308 and 311. The second electrode 311 may be formed from silver.

While not wishing to be bound by any particular theory, it is believed that operation of the conductive bridge RAM cell 330 occurs due to selective formation and dissolution of a conductive bridge formed by electromigration of silver into the memory material 309. Thus, it is important to control diffusion of silver ions into the memory material 309 during deposition of the second electrode 311.

FIGS. 3B1 through 3D illustrate embodiments of a method of forming the conductive bridge RAM cell 330 shown in FIG. 3A. As shown in FIG. 3B 1, a semiconductor structure 300 may be formed that includes an opening 306 in a dielectric material 304, the opening 306 overlying a conductive structure 303 in an interlayer dielectric material 305 overlying the first electrode 308. The first electrode 308 may be formed from a conductive material, such as tungsten, platinum, titanium nitride (TiN), or nickel. The first electrode 308 may be formed over a substrate (not shown) using conventional deposition process, such as a chemical vapor deposition process or an atomic layer deposition process. The semiconductor structure 300 may include the memory material 309 overlying surfaces of the conductive structure 303 and the interlayer dielectric material 305.

Figure 3B:
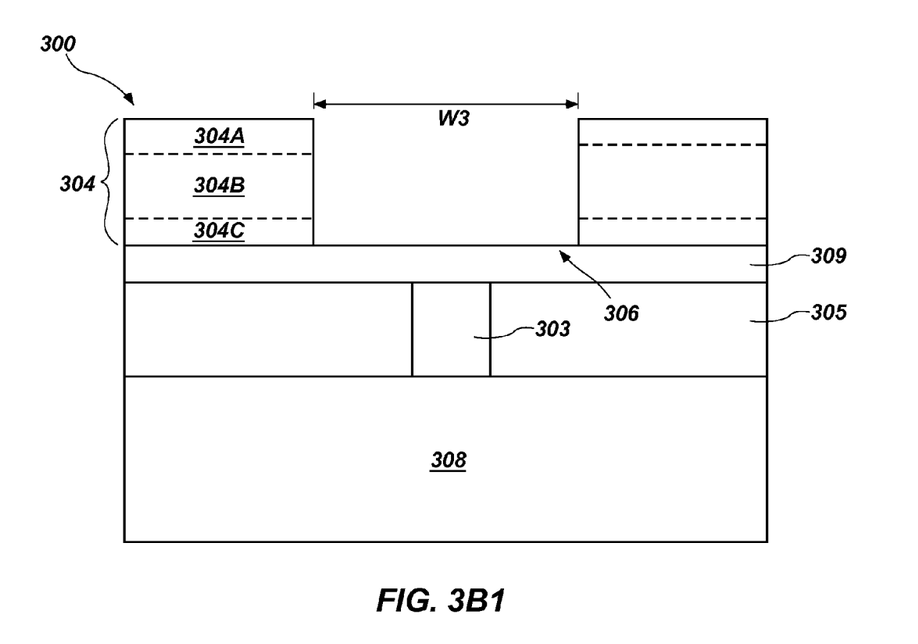

The interlayer dielectric material 305 may be formed from, for example, silicon nitride, silicon dioxide, or a silicon oxynitride. The interlayer dielectric material 305 may be formed over the first electrode 308 using a conventional deposition process, such as a chemical vapor deposition process, an atomic layer deposition process, or a physical vapor deposition process.

The conductive structure 303 may be formed from a conductive material, such as at least one of titanium nitride, tungsten, tungsten nitride, tantalum, and tantalum nitride. The conductive structure 303 may be formed in electrical connection with the first electrode 308. The conductive structure 303 may be formed in the interlayer dielectric material 305 using conventional techniques, the details of which are known in the art and, therefore, are not described in detail herein. For example, a conventional damascene process may be used to form the conductive structure 303 in the interlayer dielectric material 305 by forming a trench in the interlayer dielectric material 305, forming the conductive material over interlayer dielectric material 305 to fill the trench, and performing a chemical mechanical polishing (CMP) process to remove portions of the conductive material overlying the interlayer dielectric material 305.

The memory material 309 may be formed from a chalcogenide material, such as germanium selenide or germanium sulfide, or an oxide material, such as a high-k oxide material. Examples of suitable high-k dielectric materials include, but are not limited to, silicon dioxide, tantalum oxide, titanium oxide, nitrogen oxide, zirconium oxide, and hafnium oxide. For example, the memory material 309 may be deposited using a conventional deposition process, such as a physical vapor deposition process, a chemical vapor deposition process, or an atomic layer deposition process.

The dielectric material 304 may be formed from, for example, silicon nitride, tetraethyl orthosilicate (TEOS), silicon dioxide, or a silicon oxynitride. The dielectric material 304 may be formed over the interlayer dielectric material 305 and the conductive structure 303 using a conventional deposition process, such as a chemical vapor deposition process, an atomic layer deposition process, or a physical vapor deposition process. In some embodiments, the dielectric material 304 may be formed as a monolithic structure. In other embodiments, the dielectric material 304 may be formed as a stacked structure that includes a plurality of materials 304A. 304B, 304C, as shown in broken lines. For example, the materials 304A and 304C may be formed from silicon nitride and the material 304B may be formed from tetraethyl orthosilicate.

The opening 306 may be formed in the dielectric material 304 by removing a portion of the dielectric material 304 using, for example, conventional photolithography techniques (e.g., masking and etching) known in the art of integrated circuit fabrication. The portion of the dielectric material 304 removed to form the opening 306 may overlie the conductive structure 303 such that the opening 306 exposes a surface of the conductive structure 303 and, optionally, surfaces of the interlayer dielectric material 305 adjacent the surface of the conductive structure 303. By way of example and not limitation, the opening 306 may have a width W3 of less than about 100 nm and, more particularly, less than about 20 nm.

Figure 3B:
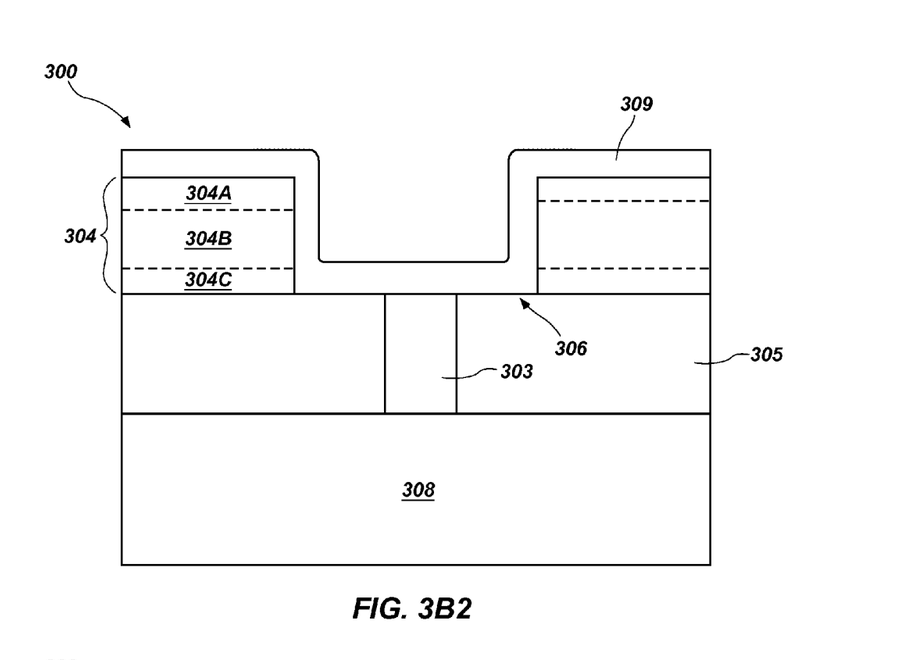

Referring to FIG. 3B2, the memory material 309 may alternatively be formed over sidewalls of the dielectric material 304 and surfaces of the conductive structure 303 and the interlayer dielectric material 305 after forming the dielectric material 304 and the opening 306 in the dielectric material 304. As previously discussed with respect to FIG.

3B1, the memory material 309 may be formed from a chalcogenide material, such as germanium selenide or germanium sulfide, or an oxide material, such as a high-k oxide material, using a conventional deposition process, such as a physical vapor deposition process, a chemical vapor deposition process, or an atomic layer deposition process.

After deposition of the memory material 309, an annealing process may optionally be performed. By way of example and not limitation, the annealing process may include exposing the semiconductor structure 300 to a temperature of between about 100° C. and about 500° C. and, more particularly, a temperature of about 200° C.

Figure 3C:
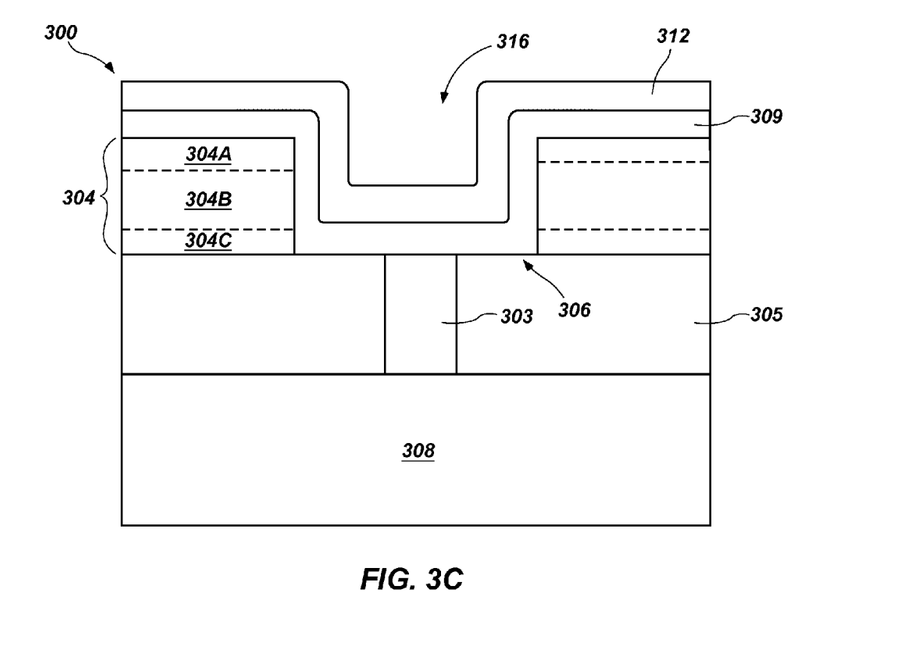

As shown in FIG. 3C, a conductive material 312 that includes silver may be formed over the memory material 309. For simplicity, the semiconductor structure 300 is shown with the memory material 309 disposed over surfaces in the opening 306 and over surfaces of the dielectric material 304. However, as configured, the memory material 309 may also be disposed between the interlayer dielectric material 305 and the dielectric material 304 as shown in FIG. 3B1.

Forming silver using a conventional vapor deposition process, such as a physical vapor deposition (PVD) process or a chemical vapor deposition (CVD) process, may cause undesirable diffusion of the silver into the memory material 309 during formation of the second electrode 311 (FIG. 3A). Such diffusion of the silver may results in variability in cell-to-cell operation of the conductive bridge RAM device. Thus, the conductive material 312 may be formed from silver (Ag) or a silver alloy using a conventional sputtering process. By way of example and not limitation, the conductive material 312 may be substantially conformally deposited over an entire exposed surface of the memory material 309. A thickness of the conductive material 312 may be such that a portion of the opening 306 remains unfilled (i.e., unfilled region 316). By way of example and not limitation, the conductive material 312 may be formed having a thickness of between about 10 nm and about 20 nm.

Figure 3D:
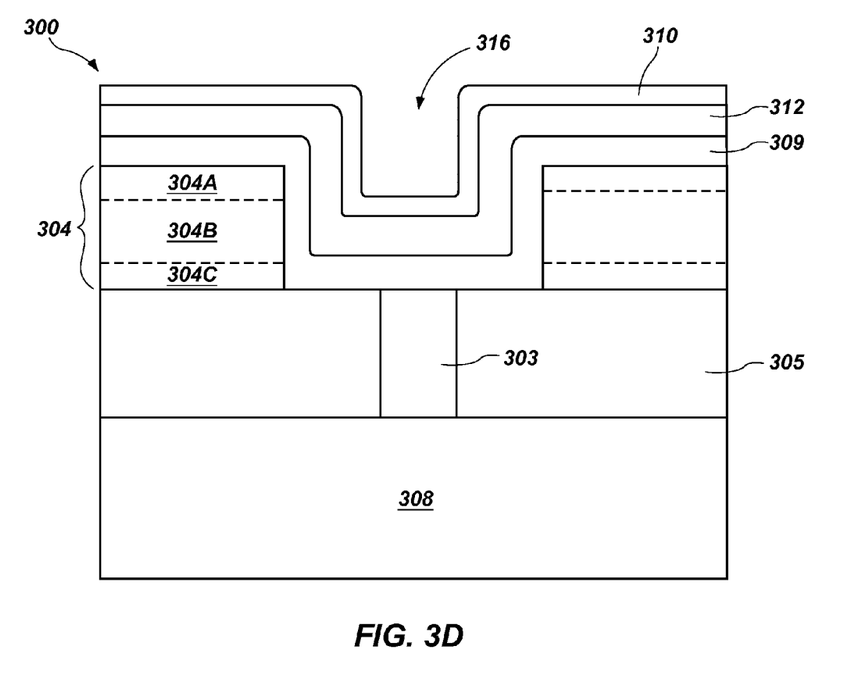

Referring to FIG. 3D, a liner material 310 may be formed over surfaces of the conductive material 312. For example, the liner material 310 may be formed from at least one of platinum, tantalum, aluminum (Al), lead (Sb), copper, iridium, titanium, nickel, cobalt, ruthenium, and rhodium. The liner material 310 may be formed using a conventional deposition process, such as a chemical vapor deposition process, a physical vapor deposition process, or a sputtering process. By way of example and not limitation, the liner material 310 may be formed having a thickness of between about 0.5 nm and about 20 nm and, more particularly, between about 1 nm and about 5 nm.

Removal of silver from unwanted areas may be complicated as there are currently no known etchants for selectively removing the silver with respect to the other materials. Thus, material (i.e., the conductive material 312 and the liner material 310) may be pushed or redistributed from upper surfaces of the dielectric material 304 into voids (e.g., the unfilled region 316 of the opening 306 (FIG. 3C)) by subjecting an exposed surface of the semiconductor structure 300 to a polishing process, as described with respect to FIG. 3D. During the polishing process, the unfilled region 316 (FIGS. 3C and 3D) may be filled to form the second electrode 311 shown in FIG. 3A. Optionally, an annealing process may then be performed to form an alloy of the conductive material 312 and the liner material 310. For example, in embodiments in which the liner material 310 comprises platinum, aluminum (Al), lead (Sb), copper, iridium, titanium, nickel, cobalt, ruthenium, and rhodium, the annealing process may be performed to form the alloy. In embodiments in which the annealing process is performed before deposition of the conductive material 312, the annealing process may be bypassed at this stage. The annealing process may include exposing the semiconductor structure 300 to a temperature of between about 100° C. and about 500° C. and, more particularly, about 200° C. By way of example and not limitation, the conductive material 312 may be formed from silver, the liner material 310 may be formed from platinum, and a silver-platinum alloy may be formed during the annealing process. A majority of the alloy or substantially all of the alloy may be located in a region of the second electrode 311 (FIG. 3A) opposite a surface of the memory material 309 such that a region of the second electrode 311 in contact with or adjacent to the memory material 309 substantially includes silver.

In FIGS. 3A through 3D, embodiments of methods of forming a silver-containing conductive element (i.e., the second electrode 311) are illustrated in the conductive bridge RAM cell 330. However, such methods may also be used to form other conductive elements in a multitude of semiconductor structures and devices, as would be understood by one of ordinary skill in the art.

EXAMPLES

Example 1

A plurality of trenches was formed in a silicon dioxide material overlying a silicon wafer. The trenches of the plurality each had a depth of about 50 nm. Silver was deposited over the surface of the silicon wafer using a conventional sputtering process. The sputtering process was performed using a conventional sputter coater. The silver was sputtered over the surface of the silicon wafer for about two minutes, during which time the silver reached a thickness of about 15 nm. Platinum was then formed over the silver using the sputter coater. The platinum was sputtered over the surface of the silicon wafer for about 30 seconds, during which time the platinum reached a thickness of about 6 nm.

A mechanical polishing process was performed on the silicon wafer having the silver and platinum thereon using deionized water and a conventional polishing pad. No chemical slurry was used during the mechanical polishing process. The surface of the platinum was polished using a pad rotation of about 100 RPM. After the mechanical polishing process, a scanning electron microscope (SEM) was used to observe that the trenches were substantially filled with material (e.g., the silver and the platinum).

An annealing process was then performed using a conventional industrial oven. The industrial oven was set to 200° C., and the silicon wafer having the silver and platinum thereon was placed therein for about 10 minutes. It was confirmed that the post-annealed silver-platinum alloy was substantially smooth with low resistance.

CONCLUSION

In one embodiment, the present disclosure includes methods of forming at least one conductive element. Such a method may include forming a first conductive material over a structure comprising at least one opening defined by sidewalls of a dielectric material, forming a second conductive material comprising silver over the first conductive material, and annealing the structure to form a material comprising at least a portion of the first conductive material and the second conductive material.

A method of forming the conductive element may also include forming a conductive material comprising silver over surfaces of a structure comprising at least one opening defined by sidewalls of a dielectric material, forming another conductive material over the conductive material, and performing a polishing process to substantially redistribute at least one of the conductive material and the another conductive material into an unfilled region of the at least one opening.

In a further embodiment, the present disclosure includes a method of forming a semiconductor structure. The method may include removing a portion of a dielectric material overlying a substrate to form at least one opening therein, forming a first conductive material over the dielectric material and exposed surfaces of the at least one opening, forming a second conductive material comprising silver over the first conductive material, a portion of the at least one opening remaining unfilled, and performing a polishing process to substantially fill the unfilled portion of the at least one opening.

In yet another embodiment, the present disclosure includes a method of forming a memory cell. The method includes forming a first conductive material over surfaces of a structure comprising at least one opening overlying a first electrode, forming a memory material over the first conductive material, forming a second conductive material comprising silver over the memory material, a portion of the at least one opening remaining unfilled, and performing a process to substantially fill the at least one opening with the memory material and the second conductive material.

The method of forming the memory cell may also include forming a first conductive material comprising silver over surfaces of a memory material exposed by at least one opening overlying a first electrode, forming a second conductive material over the first conductive material, a portion of the at least one opening remaining unfilled, and performing a process to substantially fill the at least one opening with the memory material and the first and second conductive materials.

In yet another embodiment, the present disclosure includes a semiconductor structure. The semiconductor structure may include a conductive structure overlying an electrode, at least one of a chalcogenide material and an oxide material in contact with the conductive structure, and a conductive material overlying the chalcogenide material, the conductive material comprising silver, and at least one region comprising another material.

In further embodiments, the present disclosure includes a memory cell. The memory cell includes a memory material overlying an electrode. The memory cell also includes a conductive material comprising silver and another material. The conductive material overlies the memory material and is disposed in at least one opening.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a semiconductor structure, comprising:
   forming a structure having at least one opening defined by sidewalls of a dielectric material, comprising:
      forming the dielectric material over a conductive structure overlying an electrode; and
      defining the at least one opening in the dielectric material;
   forming at least one of a chalcogenide material or an oxide material in contact with the conductive structure;
   forming a conductive material comprising silver over the at least one of the chalcogenide material or the oxide material and over surfaces of the structure having the at least one opening;
   forming another conductive material over the conductive material; and
   performing a polishing process to substantially redistribute at least one of the conductive material or the another conductive material into an unfilled region of the at least one opening to form another conductive structure overlying the at least one of the chalcogenide material or the oxide material,
   the semiconductor structure comprising:
   the conductive structure overlying the electrode;
   the dielectric material overlying the electrode;
   at least one of the chalcogenide material or the oxide material in contact with the conductive structure; and
   the another conductive structure overlying the at least one of the chalcogenide material or the oxide material, an upper surface of the another conductive structure being coplanar with an upper surface of the dielectric material, the another conductive structure comprising:
      at least one region comprising the silver in contact with the at least one of the chalcogenide material or the oxide material; and
      at least one other region comprising the another conductive material above the at least one region comprising the silver, a majority of or substantially all of the another conductive material being spaced from the at least one of the chalcogenide material or the oxide material by the conductive material comprising the silver, the another conductive material comprising at least one of platinum, tantalum, aluminum, lead, copper, iridium, titanium, nickel, cobalt, ruthenium, or rhodium.

2. The method of claim 1, wherein forming a conductive material comprising silver over the at least one of the chalcogenide material or the oxide material and over surfaces of the structure having the at least one opening comprises forming the conductive material comprising silver over the sidewalls of the dielectric material and a surface of an electrode between the sidewalls of the dielectric material.

3. A method of forming a memory cell, comprising:
   forming a memory material over surfaces of a structure defining therein at least one opening overlying an electrode, the memory material comprising at least one of a chalcogenide material or an oxide material;
   forming silver and another material over the memory material and in the at least one opening defined in the structure, a portion of the at least one opening remaining unfilled; and
   substantially filling the at least one opening with the memory material, the silver, and the another material to form a conductive structure, the memory cell comprising:
the memory material overlying the electrode; and
the conductive structure comprising the silver and the another material above the silver, the conductive structure disposed above the memory material and disposed in the at least one opening defined in the structure, an upper surface of the conductive structure being coplanar with a surface of the structure, a majority of or substantially all of the another material being spaced from the memory material by the silver, the another material comprising an alloy of the silver and at least one of platinum, tantalum, aluminum, tin, copper, iridium, titanium, nickel, cobalt, ruthenium, or rhodium.

4. The method of claim 3, wherein forming a memory material comprises forming at least one of germanium sulfide or germanium selenide.

5. The method of claim 3, wherein forming a memory material comprises forming at least one of silicon dioxide, tantalum oxide, titanium oxide, nitrogen oxide, zirconium oxide, or hafnium oxide.

6. The method of claim 3, wherein forming silver and another material over the memory material and in the at least one opening defined in the structure comprises:
forming the silver over the memory material and in the at least one opening defined in the structure; and
forming the another material, comprising a conductive material, over the silver and in the at least one opening defined in the structure.

7. A method of forming a memory cell, comprising:
forming a first conductive material comprising silver over surfaces of a memory material exposed by at least one opening overlying an electrode and defined in a structure, the memory material comprising at least one of a chalcogenide material or an oxide material;
forming a second conductive material over the first conductive material, a portion of the at least one opening remaining unfilled; and
substantially filling the at least one opening with at least one of the memory material, the first conductive material, or the second conductive material to form a conductive structure,
the memory cell comprising:
the memory material overlying the electrode; and
the conductive structure comprising the silver and the second conductive material above the silver, the conductive structure disposed above the memory material and disposed in the at least one opening defined in the structure, an upper surface of the conductive structure being coplanar with a surface of the structure, a majority of or substantially all of the second conductive material being spaced from the memory material by the silver, the second conductive material comprising an alloy of the silver and at least one of platinum, tantalum, aluminum, tin, copper, iridium, titanium, nickel, cobalt, ruthenium, or rhodium.

8. The method of claim 7, wherein substantially filling the at least one opening with at least one of the memory material, the first conductive material, or the second conductive material comprises performing a polishing process using a liquid component consisting of water to redistribute, into the at least one opening, the at least one of the memory material, the first conductive material, or the second conductive material from surfaces adjacent to the at least one opening.

9. A semiconductor structure, comprising:
a conductive structure overlying an electrode;
a dielectric material overlying the electrode;
at least one of a chalcogenide material or an oxide material in contact with the conductive structure; and
another conductive structure overlying the at least one of the chalcogenide material or the oxide material, an upper surface of the another conductive structure being coplanar with an upper surface of the dielectric material, the another conductive structure comprising:
at least one region comprising silver in contact with the at least one of the chalcogenide material or the oxide material; and
at least one other region comprising another material above the at least one region comprising the silver, a majority of or substantially all of the another material being spaced from the at least one of the chalcogenide material or the oxide material by the at least one region comprising the silver, the another material comprising at least one of platinum, tantalum, aluminum, lead, copper, iridium, titanium, nickel, cobalt, ruthenium, or rhodium.

10. The semiconductor structure of claim 9, wherein the another material comprises the platinum.

11. The semiconductor structure of claim 9, wherein the another material comprises the tantalum.

12. A memory cell, comprising:
a memory material overlying an electrode, the memory material comprising at least one of a chalcogenide material or an oxide material; and
a conductive structure comprising silver and another material above the silver, the conductive structure disposed above the memory material and disposed in at least one opening defined in another structure, an upper surface of the conductive structure being coplanar with a surface of the another structure, a majority of or substantially all of the another material being spaced from the memory material by the silver, the another material comprising an alloy of the silver and at least one of platinum, tantalum, aluminum, tin, copper, iridium, titanium, nickel, cobalt, ruthenium, or rhodium.

13. The memory cell of claim 12, wherein the another material comprises a mixture of the tantalum and the silver.

14. The method of claim 1, further comprising, before performing the polishing process, reacting the conductive material and the another conductive material to form an intermetallic compound.

* * * * *

UNITED STATES PATENT AND TRADEMARK OFFICE
CERTIFICATE OF CORRECTION

PATENT NO. : 9,520,558 B2  
APPLICATION NO. : 13/961479  
DATED : December 13, 2016  
INVENTOR(S) : Sanh D. Tang et al.

Page 1 of 1

It is certified that error appears in the above-identified patent and that said Letters Patent is hereby corrected as shown below:

In the Specification  
Column 9,    Line 55,    change "FIG. 3B 1," to --FIG. 3B1,--  
Column 10,   Line 45,    change "materials 304A. 304B," to --materials 304A, 304B,--

Signed and Sealed this  
Seventh Day of March, 2017

Michelle K. Lee  
*Director of the United States Patent and Trademark Office*